(12) United States Patent
Maerz et al.

(10) Patent No.: US 9,294,087 B2
(45) Date of Patent: *Mar. 22, 2016

(54) INTEGRATED HALL-CONTROLLED SWITCH DEVICES

(75) Inventors: Sebastian Maerz, Berg (DE);
Jean-Marie Le Gall, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 115 days.

This patent is subject to a terminal disclaimer.

(21) Appl. No.: 13/267,308

(22) Filed: Oct. 6, 2011

(65) Prior Publication Data
US 2013/0087868 A1    Apr. 11, 2013

(51) Int. Cl.
*H01L 29/82*   (2006.01)
*H03K 17/95*   (2006.01)

(52) U.S. Cl.
CPC .................... *H03K 17/9517* (2013.01)

(58) Field of Classification Search
CPC ............................ G01R 33/0047; G01R 33/06
USPC ....... 482/1; 257/421; 324/244, 251; 341/110; 327/564
See application file for complete search history.

(56) References Cited

U.S. PATENT DOCUMENTS

| 2008/0125288 A1* | 5/2008 | Case | 482/1 |
| 2011/0234218 A1* | 9/2011 | Lagouge | 324/247 |
| 2011/0254611 A1* | 10/2011 | Volkmann | 327/365 |
| 2012/0182658 A1* | 7/2012 | Motz | 361/91.5 |

OTHER PUBLICATIONS

Infineon, Smart High-Side Power Switch BTS4140N, Smart High-Side Power Switch One Channel: 1 x 1Ω, dated May 29, 2007, 14 pages.
Infineon, Hall Sensors for Automotive, Industrial, and Consumer Applications, as available on Oct. 6, 2011, at www.infineon.com, 5 pages.
Magnasphere Corp., Technology Overview: Magnasphere, available at www.Magnasphere.com, revised Feb. 18, 2010, 2 pages.
Notice of Allowance Dated Jul. 17, 2015 U.S. Appl. No. 13/366,917.

* cited by examiner

*Primary Examiner* — Kenneth Parker
*Assistant Examiner* — Bo Fan
(74) *Attorney, Agent, or Firm* — Eschweiler & Associates, LLC (57) ABSTRACT

Embodiments relate to Hall-controlled switch devices. In an embodiment, a Hall switch and a load switch are integrated in a single integrated circuit device. Embodiments can provide load switching and optional simultaneous logic signaling, for example to update a microcontroller or electronic control unit (ECU), while reducing space and complexity and thereby cost.

22 Claims, 6 Drawing Sheets

INTEGRATED HALL-CONTROLLED SWITCH DEVICES

TECHNICAL FIELD

The invention relates generally to switch devices and more particularly to Hall sensor-controlled switch devices.

BACKGROUND

Semiconductor Hall sensors are currently used for logic signaling but typically are able to switch only a limited load current. Therefore, two separate devices are currently used: a Hall sensor and a load switching integrated circuit (IC). Usually, in operation, a Hall sensor signal indicative of a switching state is received by a microcontroller which in turn activates the load switching IC. The Hall sensor and the load switching IC are typically soldered on a printed circuit board (PCB). Such a configuration uses more board and package space than is desired and is more complex in terms in of periphery space and wiring, each of which in turn leads to a higher cost.

Therefore, there is a need for improved power switches that take advantage of the robustness and reliability of Hall sensors.

SUMMARY

Embodiments relate to integrated Hall-controlled switch devices, such as transistors, current sources, and power switches, among others.

In an embodiment, A Hall-controlled device comprises an integrated circuit package; Hall switch circuitry disposed in the package; and load switch circuitry coupled to the Hall switch circuitry and disposed in the package.

In an embodiment, a method comprises sensing a magnetic field by a Hall-effect sensor disposed in a package; sending a signal related to the magnetic field by the sensor to a load switch disposed in the package; and selectively switching a load by the load switch according to the signal from the sensor.

In an embodiment, an integrated circuit comprises Hall-effect switching circuitry comprising a Hall-effect element; load switching circuitry coupled to the Hall-effect switching circuitry; and an integrated circuit package housing the Hall-effect switching circuitry and the load switching circuitry.

In an embodiment, a Hall-controlled device comprises an integrated circuit package; Hall switch circuitry arranged in the package; load switch circuitry arranged in the package and coupled to the Hall switch circuitry; and a back bias magnetic material coupled to the package.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated Hall-controlled switch devices, such as transistors, current sources, and power switches, among others. In an embodiment, a Hall switch and a load switch are integrated in a single integrated circuit device. In embodiments, the device can also include integrated load protection and load diagnostics. Embodiments can provide load switching and optional simultaneous logic signaling, for example to update a microcontroller or electronic control unit (ECU), while reducing space and complexity and thereby cost.

Figure 1A:
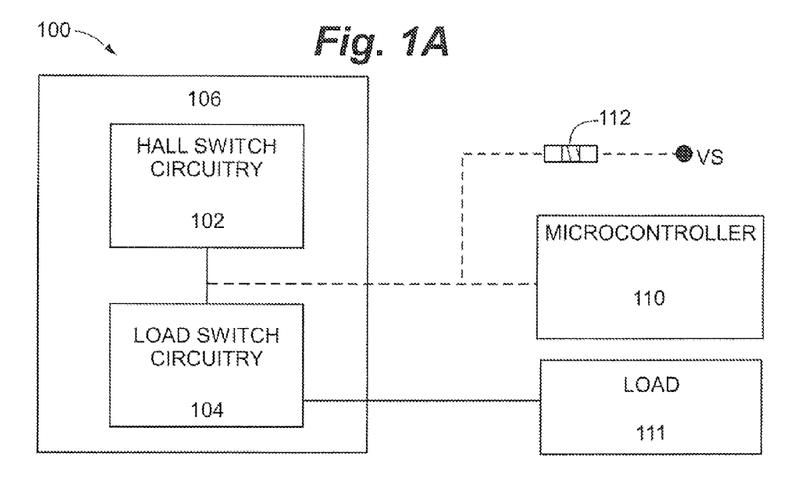
FIG. 1A is a block diagram of an integrated Hall switch device according to an embodiment.
Figure 1B:
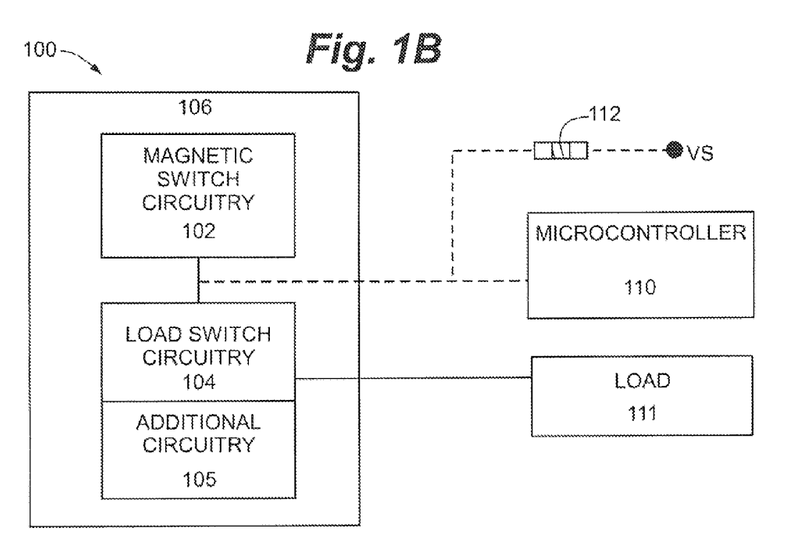
FIG. 1B is a block diagram of an integrated Hall switch device according to an embodiment.
Figure 2:
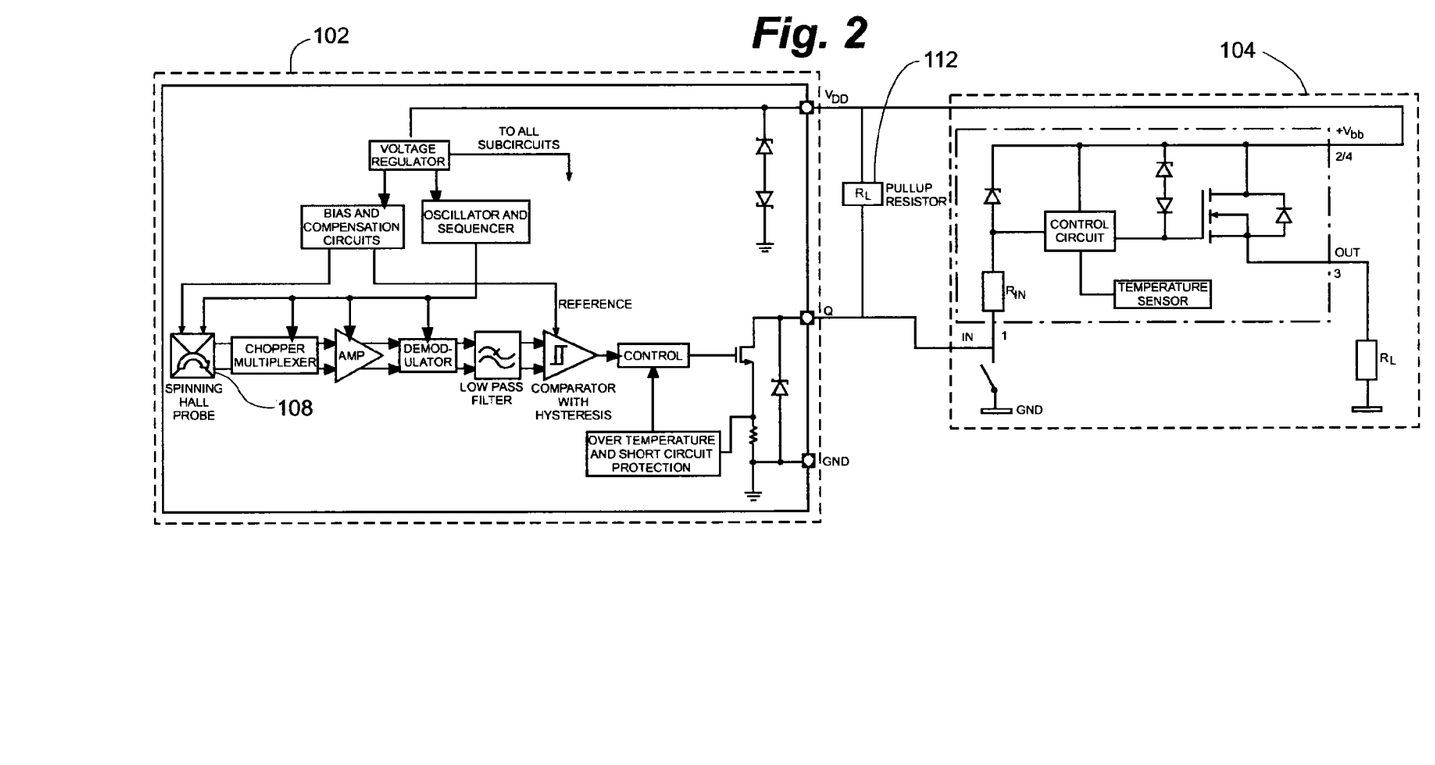
FIG. 2 is a circuit block diagram of an integrated Hall switch device according to an embodiment.

Referring to FIGS. 1A, 1B and 2, a block diagram of a Hall-controlled switch device 100 according to an embodiment is depicted. Device 100 comprises Hall switch circuitry 102 and load switch circuitry 104 integrated in a single package 106 in an embodiment. In the embodiment of FIG. 1B, device 100 also comprises additional circuitry 105, which in embodiments can comprise at least one of additional load switch circuitry, integrated load protection circuitry or integrated load diagnostics disposed in package 106.

Hall switch circuitry 102 comprises at least one Hall-effect sensor element 108 configured to detect a position of a magnet. In embodiments, Hall switch circuitry 102 is configured to act as a switch and to provide switch logic level information to an external microcontroller 110, though this latter feature can be omitted in other embodiments. Load switch circuitry 104, in embodiments, comprises a transistor, such as a field effect transistor (FET), linear current control circuitry, an active power switch such as a high-side power switch, an nMOS device, a pMOS device, a linear current source, a switched current source or some other suitable device configured to switch or other control a load 111. For example, load switch circuitry 104 can comprise a power FET in one embodiment. While device 100 is depicted comprising a single load switch circuitry 104 block, other embodiments can comprise a plurality of load switch circuitry 104 blocks, which can be desired in some applications.

In embodiments, switch 100 also comprises a pull-up resistor 112. As depicted in FIGS. 1A and 1B, pull-up resistor 112 is external to package 106. In other embodiments, pull-up resistor 112 is integrated with Hall switch circuitry 102 and load switch circuitry 104 in package 106.

Hall switch circuitry 102 and load switch circuitry 104 can be configured within package 106 in various ways. For example, embodiments can comprise single- or dual-die configurations, including chip-on-chip, chip-by-chip and other suitable arrangements.

Figure 3A:
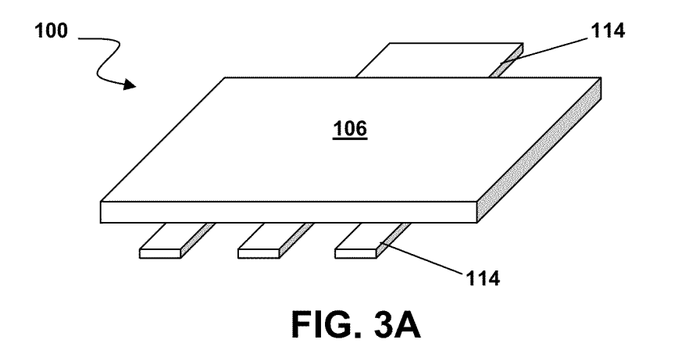
FIG. 3A is a diagram of a Hall switch device package according to an embodiment.
Figure 3B:
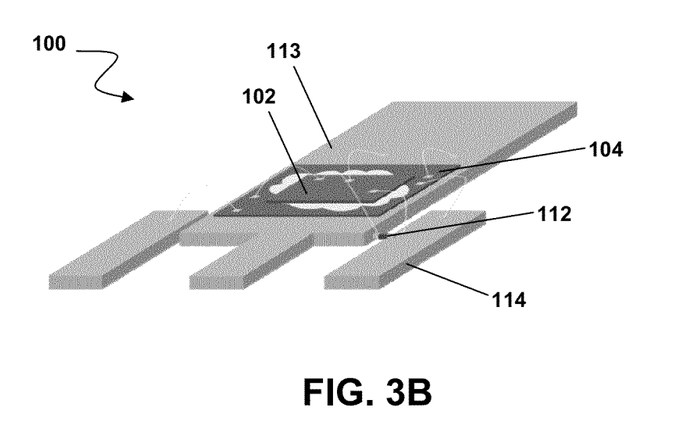
FIG. 3B is a diagram of the Hall switch device of FIG. 3A without the package according to an embodiment.

Referring to FIGS. 3A and 3B, device 100 can comprise a chip-on-chip configuration of Hall switch circuitry 102 and load switch circuitry 104 on a leadframe 113, with an internal pull-up resistor 112 within package 106. The relative chip-on-chip arrangement of circuitries 102 and 104 can vary in other embodiments. Switch 100 can alternatively comprise an external pull-up resistor 112. In one embodiment, device 100 is formed on a single semiconductor die, while in other embodiments a plurality of dies are used.

Figure 4A:
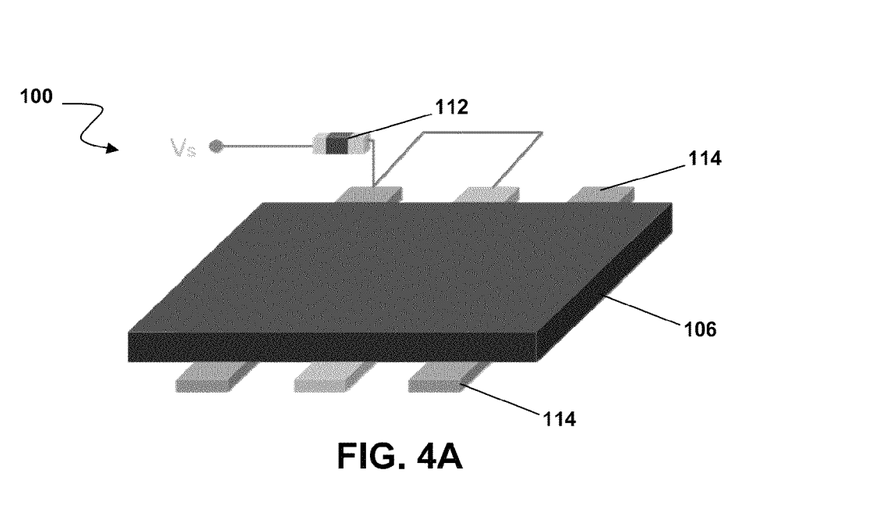
FIG. 4A is a diagram of a Hall switch device package according to an embodiment.
Figure 4B:
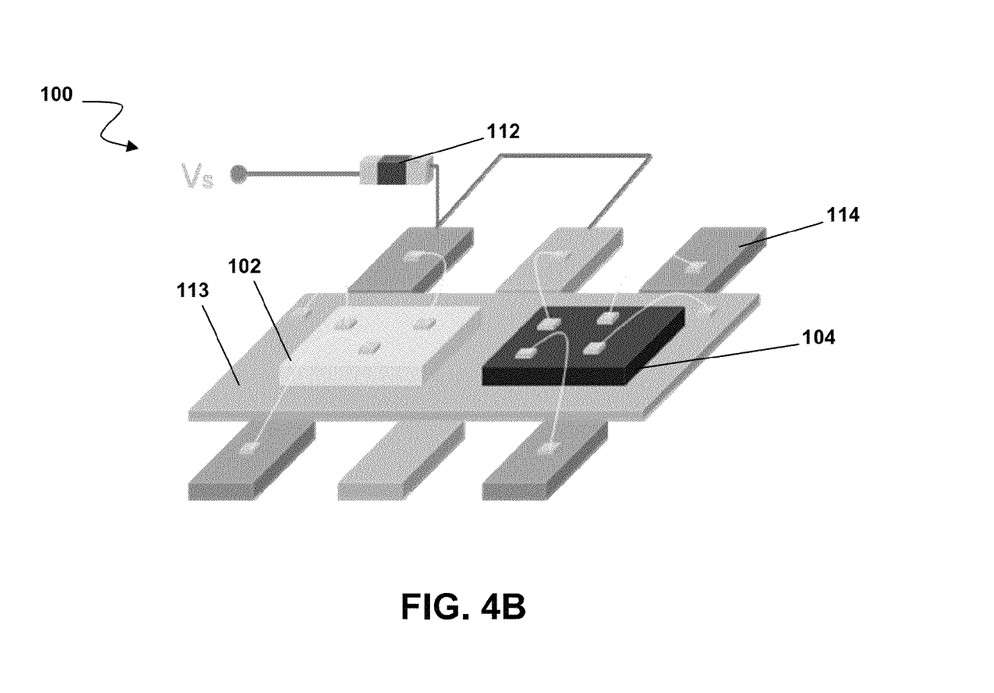
FIG. 4B is a diagram of the Hall switch device of FIG. 4A without the package according to an embodiment.

Referring to FIGS. 4A and 4B, device 100 can comprise a chip-by-chip configuration of Hall switch circuitry 102 and load switch circuitry 104 on leadframe 113, with an internal or external pull-up resistor 112 (depicted as external in FIGS. 4A and 4B).

Figure 5:
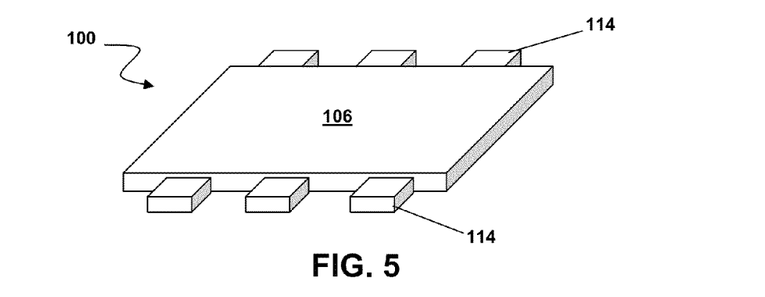
FIG. 5 is a diagram of a Hall switch device package according to an embodiment.

In FIG. 5, one of Hall switch circuitry 102 and load switch circuitry 104 (not visible) can be mounted on top of the leadframe while the other is mounted on the bottom. In can be advantageous, for example, to mount Hall switch circuitry 102 on top of the leadframe such that it can be positioned closer to the magnet to minimize the air gap, with load switch circuitry on the bottom to dissipate more heat to the board.

Figure 6A:
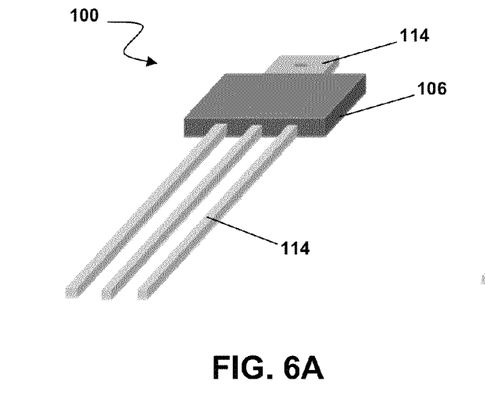
FIG. 6A is a diagram of a Hall switch device package according to an embodiment.
Figure 6B:
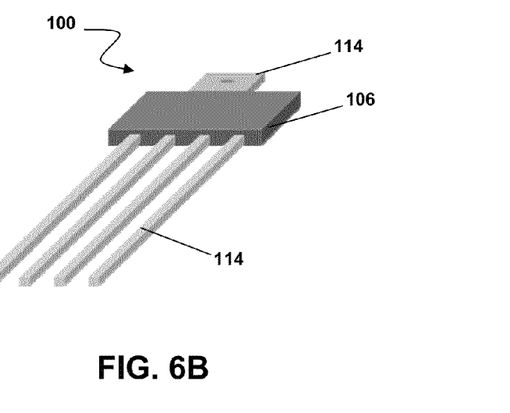
FIG. 6B is a diagram of a Hall switch device package according to an embodiment.
Figure 7:
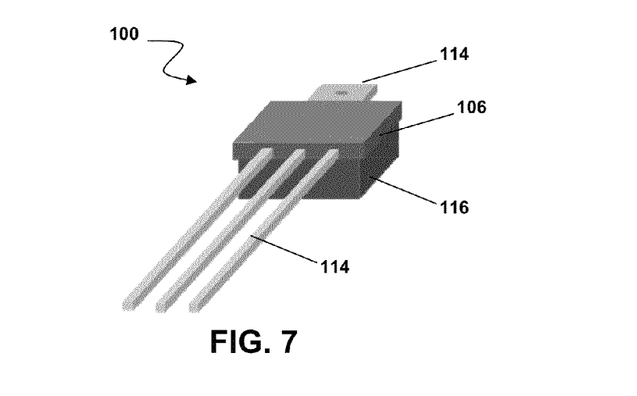
FIG. 7 is a diagram of a Hall switch device package according to an embodiment.

The configuration of package 106 and leads 114, including the wirebonds as depicted, which can comprise other coupling types and configurations, can also vary in embodiments and/or applications, as appreciated by those skilled in the art. For example, some applications can require a particular external pull-up resistor, while others can select a particular configuration according to price sensitivity or some other characteristic. Device 100 can comprise virtually surface-mount device (SMD) in embodiments, with a variety of package and lead configurations and types. For example, FIGS. 6A and 6B depict three- and four-pin lead embodiments. Embodiments having extended lead lengths can be advantageous in embodiments in applications in which it is desired or required to have flexibility in the positioning of device 100. Longer leads provide more options for positioning, such as in remote locations, or the leads can be trimmed for more proximate locations. In another example, FIG. 7 depicts an integrated back bias (IBB) embodiment of device 100 and package 106, in which a magnet 116 is coupled in, on or to package 106.

In operation, a single integrated device 100 can signal load and logic in parallel. A load can be switched by load switching circuitry 104 using the Hall effect by recognizing, by Hall switch circuitry 102, the transgression of a magnetic field strength while, optionally, sending a logic signal to microcontroller 110 to indicate the change in state. Thus, the load can be driven and switched locally and directly by a single device, as opposed to conventional solutions in which a first device provides a logic signal to the microcontroller, which in turn signals a second device to switch a load.

Figure 8A:
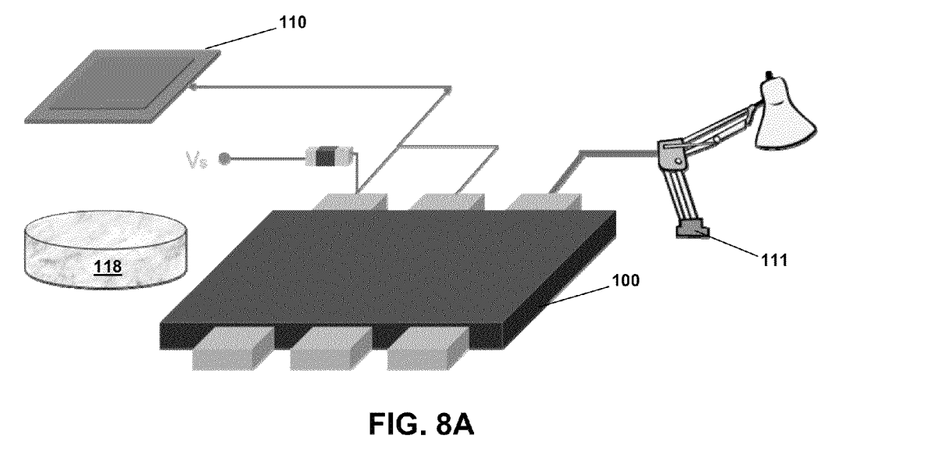
FIG. 8A is a diagram of an example implementation of a Hall switch device according to an embodiment.
Figure 8B:
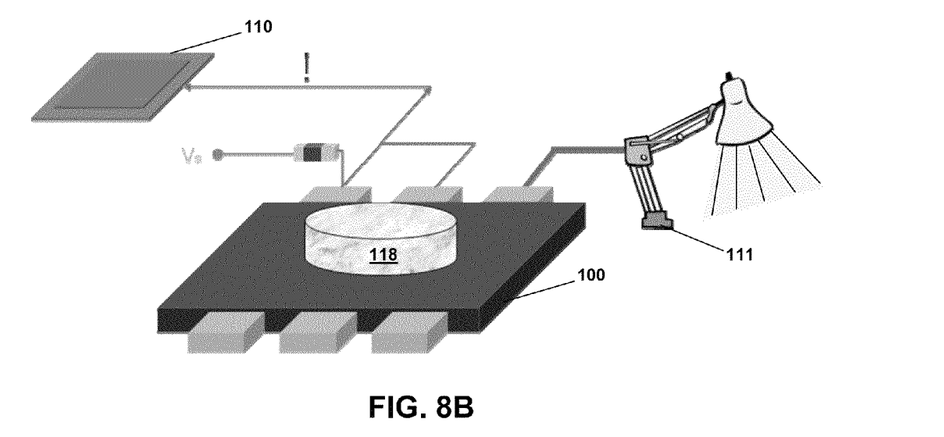
FIG. 8B is a diagram of an example implementation of a Hall switch device according to an embodiment.

Referring to the example of FIGS. 8A and 8B, device 100 is coupled to a microcontroller 110 and a load 111. A varying magnetic field is represented by a magnet 118 In FIG. 8A, load 111 is switched off by device 100, whereas in FIG. 8B the change in magnetic field when magnet 118 shifts is sensed by Hall switch circuitry 102 (not visible) such that, in parallel, the state of load 111 is switched, and microcontroller 110 is informed. In other embodiments, the switching can operate in the opposite manner or some other way, with FIGS. 8A and 8B being used to illustrate but one simplified example.

Switch 100 has many applications, including lighting, domestic appliance, lifestyle and automotive, among others. Specific, though non-limiting, examples include cosmetics mirrors, drawer and cupboard lighting, automotive and vehicular brake lights, and refrigerator/freezers. Switch 100 comprising a low-power Hall switch can also be used for autonomous power saving lighting applications. Additionally, embodiments can be used as LED drivers, linear current sources or switching current regulators, such as for integrated magnetic LED switches. In some embodiments, loads can be about 100 mA to about 50 A or more, for example about 100 mA to about 5 A, or about 1 A to about 20 A, or some other range, with voltages of about 1 V to about 35 V or more, though these ranges can vary in other embodiments.

Embodiments provide many advantages. Cost savings can be realized with respect to conventional solutions because only a single package is necessary. The single package also requires less space, less wiring and less periphery. For example, low-cost construction can include a solid-state relay mounting. With respect to functionality, the load is switched directly by the switch, rather than by a microcontroller, which becomes optional. In embodiments having a microcontroller, the microcontroller is always updated, and lifetime advantages can be realized in view of the robustness, reliability and durability of Hall switches as opposed to conventional mechanical solutions. Embodiments also provide improved controllability of switching activities.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A Hall-controlled device comprising:
   Hall switch circuitry;
   load switch circuitry coupled to the Hall switch circuitry; and
   an integrated circuit package comprising a current input and a current output, a current flow from the current input to the current output controlled by the load switch circuitry; and
   a leadframe disposed in the integrated circuit package, wherein the Hall switch circuitry is arranged on a first, to side of the leadframe configured to face a magnetic field source and the load switch circuitry is arranged on a second, bottom side of the leadframe configured to face a circuit board or other mounting surface to which the leadrame is configured to attach opposing the first side,
   wherein the current output is configured to be coupled to an external load to be switched.

2. The Hall-controlled device of claim 1, further comprising a pull-up resistor coupled to the Hall switch circuitry and the load switch circuitry.

3. The Hall-controlled device of claim 1, wherein the load switch circuitry comprises one of a transistor, an active power switch, an nMOS device, a pMOS device, a linear current source, or a switched current source.

4. The Hall-controlled device of claim 1, wherein the Hall switch circuitry is configured to send a logic signal to a microcontroller.

5. The Hall-controlled device of claim 1, further comprising at least one additional load switch circuitry coupled to the Hall switch circuitry and disposed in the package.

6. The Hall-controlled device of claim 1, further comprising at least one of integrated load protection circuitry or integrated load diagnostics disposed in the integrated circuit package.

7. A method comprising:
   sensing a magnetic field by a Hall-effect sensor comprising Hall switch circuitry disposed in an integrated circuit package comprising a current input and a current output;
   sending a signal related to the magnetic field by the sensor to a load switch disposed in the integrated circuit package; and
   selectively switching, by the load switch and according to the signal from the sensor, a load external to the integrated circuit package and coupled to the current output,
   wherein a leadframe is disposed in the integrated circuit package, and the Hall switch circuitry is arranged on a first, to side of the leadframe configured to face a magnetic field source and the load switch is arranged on a second, bottom side of the leadframe configured to face a circuit board or other mounting surface to which the leadrame is configured to attach opposing the first side.

8. The method of claim 7, wherein sending a signal further comprises sending a signal related to the magnetic field by the sensor to a microcontroller.

9. The method of claim 7, further comprising integrating a pull-up resistor in the integrated circuit package.

10. An integrated circuit comprising:
    Hall-effect switching circuitry comprising a Hall-effect element;
    load switching circuitry coupled to the Hall-effect switching circuitry;
    an integrated circuit package housing the Hall-effect switching circuitry and the load switching circuitry and comprising an output to couple the integrated circuit package to an external load to be controlled by the load switching circuitry; and
    a leadframe disposed in the integrated circuit package, wherein the Hall switching circuitry is arranged on a first, to side of the leadframe configured to face a magnetic field source and the load switching circuitry is arranged on a second, bottom side of the leadframe configured to face a circuit board or other mounting surface to which the leadrame is configured to attach opposing the first side.

11. The integrated circuit of claim 10, further comprising a pull-up resistor housed in the package.

12. The integrated circuit of claim 10, wherein the Hall-effect switching circuitry is configured to send a logic signal and a load-control signal in parallel.

13. A Hall-controlled device comprising:
    an integrated circuit package;
    Hall switch circuitry arranged in the integrated circuit package;
    load switch circuitry arranged in the integrated circuit package and coupled to the Hall switch circuitry;
    a back bias magnetic material coupled to the integrated circuit package; and
    a leadframe disposed in the integrated circuit package, wherein the Hall switch circuitry is arranged on a first, to side of the leadframe configured to face a magnetic field source and the load switch circuitry is arranged on a second, bottom side of the leadframe configured to face a circuit board or other mounting surface to which the leadrame is configured to attach opposing the first side.

14. The Hall-controlled device of claim 13, wherein the back bias magnetic material is coupled to the package within the package.

15. The method of claim 7, further comprising providing at least one of integrated load protection circuitry or integrated load diagnostics disposed in the package.

16. The integrated circuit of claim 10, further comprising at least one of integrated load protection circuitry or integrated load diagnostics housed in the package.

17. The Hall-controlled device of claim 13, further comprising at least one of integrated load protection circuitry or integrated load diagnostics arranged in the package.

18. The Hall-controlled device of claim 2, further comprising a pull-up resistor coupled to the Hall switch circuitry and the load switch circuitry, wherein the pull-up resistor is external to a die on which the Hall switch circuitry resides and is external to a die on which the load switch circuitry resides, and wherein the pull-up resistor is disposed in the integrated circuit package within which the Hall switch circuitry and the load switch circuitry reside.

19. The Hall-controlled device of claim 1, wherein at least one of the Hall switch circuitry and the load switch circuitry comprise a temperature sensing circuit configured to generate a temperature output signal indicative of a sensed temperature and a control circuit configured to deactivate the at least one of the Hall switch circuitry and the load switch circuitry, respectively, if the sensed temperature as indicated by the temperature output signal exceeds a predetermined threshold.

20. The Hall-controlled device of claim 1, wherein the load switch circuitry is coupled electrically in series with a current rail of the Hall switch circuitry.

21. The Hall-controlled device of claim 1, further comprising a back bias magnetic material coupled to the integrated circuit package.

22. The integrated circuit of claim 10, further comprising a back bias magnetic material coupled to the integrated circuit package.

\* \* \* \* \*

UNITED STATES PATENT AND TRADEMARK OFFICE
CERTIFICATE OF CORRECTION

PATENT NO. : 9,294,087 B2  
APPLICATION NO. : 13/267308  
DATED : March 22, 2016  
INVENTOR(S) : Sebastian Maerz et al.

Page 1 of 1

It is certified that error appears in the above-identified patent and that said Letters Patent is hereby corrected as shown below:

In the claims

Column 5, Claim 7, Line 51 Please replace "...first, to side of the..." with --...first, top side of the...--

Column 6, Claim 10, Line 6 Please replace "...first, to side of the..." with --...first, top side of the...--

Column 6, Claim 13, Line 27 Please replace "...on a first, to..." with --...on a first, top...--

Signed and Sealed this  
Seventh Day of June, 2016

Michelle K. Lee  
*Director of the United States Patent and Trademark Office*